United States Patent [19]

George et al.

[11] 4,067,003
[45] Jan. 3, 1978

[54] PASSIVE REPLICATOR

[75] Inventors: Peter K. George, Placentia; Tsutomu Kobayashi, Orange, both of Calif.

[73] Assignee: Rockwell International Corporation, El Segundo, Calif.

[21] Appl. No.: 656,688

[22] Filed: Feb. 9, 1976

[51] Int. Cl.² .......................................... G11C 11/14
[52] U.S. Cl. .................................................... 365/12
[58] Field of Search ................................. 340/174 TF

[56] References Cited

U.S. PATENT DOCUMENTS

| 3,868,661 | 2/1975 | Bonyharo et al. | 340/174 TF |
|---|---|---|---|
| 3,876,995 | 4/1975 | Clover et al. | 340/174 TF |

Primary Examiner—Vincent P. Canney
Attorney, Agent, or Firm—L. Lee Humphries; H. Frederick Hamann; G. Donald Weber, Jr.

[57] ABSTRACT

A passive replicator comprising a plurality of elongated bars interposed between an input propagation path and a plurality of output propagation paths.

8 Claims, 4 Drawing Figures

PASSIVE REPLICATOR

The invention described herein was made in the performance of work under NASA Contract No. NAS 1-12981 and is subject to the provision of Section 305 of the National Aeronautics and Space Act of 1958 (72 Stat. 435; 42 U.S.C. 2457).

BACKGROUND

1. Field of the Invention

This invention relates to magnetic bubble domain devices, in general, and to a passive replicator, in particular.

2. Description of Prior Art

With the advent of magnetic bubble domain devices, a large amount of research and development has gone into designing and developing devices which can provide various control functions relative to magnetic bubbles in magnetic bubble domain material. These devices include propagation elements, switching devices, transfer gates and the like. One of the devices that has been developed is a replicator which permits bubbles propagating along a single input path to be supplied to a plurality of output paths. Several replicators are known in the art wherein the function thereof need not be discussed in detail herein. Moreover, many variations of replicators are known and include both passive and active replicators. However, these known replicators have associated problems and disadvantages. For example, active replicators require a control signal to be supplied thereto. This requires additional leads and structural geometry in the bubble domain system. Passive replicators of the type known in the art have disadvantages relative to throughput, high bias failures, the requirements of small spacings and high drive fields and the like. Improved devices with better operating characteristics are desirable in order to provide better system operation in the bubble domain field.

SUMMARY OF THE INVENTION

This invention relates to a passive replicator wherein a plurality of elongated bars are disposed intermediate an input propagation path and a plurality of output propagation paths. The elongated bars cause the bubble domain propagating along the input path to be stretched and expanded to interact with the plurality of output paths. A cutter bar severs the expanded bubble into a plurality of distinct bubbles, e.g. the original bubble and a replica thereof which is propagated out via an exit path. Pusher bars or foreshortened bars may be disposed relative to the elongated bars to assist in the formation and control of bubbles therein.

This replicator operates over a wide range of permalloy to garnet spacing and requires a relatively low drive field for operation.

BRIEF DESCRIPTION OF THE DRAWINGS

In the several figures, similar components bear similar reference numerals.

DESCRIPTION OF THE PREFERRED EMBODIMENT

Figure 1:
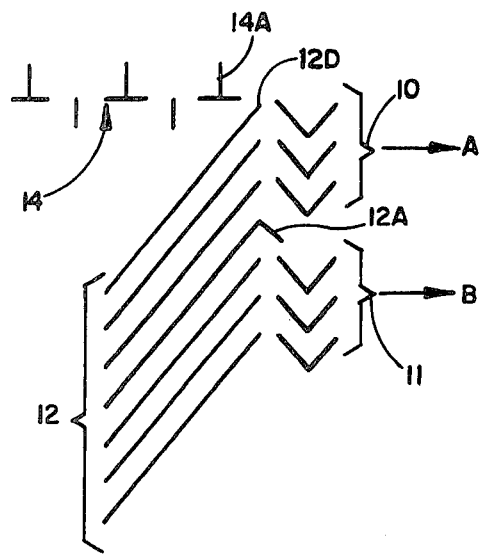
FIG. 1 is a schematic representation of the basic embodiment of the invention.

Referring now to FIG. 1, there is shown a basic embodiment of the passive replicator of the instant invention. In this representation, propagation path 14 is the input path while chevron groups 10 and 11 represent the first columns of chevrons in output paths A and B, respectively. A plurality of elongated bars 12 are disposed between the elements of the respective propagation paths. In particular, the upper bar of bars 12 has one end thereof disposed between the end of propagation path 14 and the beginning of propagation path A. Thus, the bubble propagating along path 14 transfers from element 14A to the end 12D of uppermost bar 12 under the influence of the rotating field $H_R$ which is applied to bubble domain devices. Under the influence of the field $H_R$, magnetic poles are creaed at the right-most end of each of the bars 12 wherein the bubble at 12D will rapidly expand along the right-most ends of the bars 12. By properly spacing bars 12 and using the appropriate number thereof, the bubble will expand substantially instantaneously across the right-most ends of all of the bars 12. Consequently, the bubble will extend adjacent the left ends of chevrons 10 and 11, respectively.

As the rotating field continues to rotate, magnetic poles are formed at the left end of chevrons 10 and 11 as well as the left end of cutter bar 12A which is affixed to one of the elongated bars 12. In particular, cutter bar 12A is spatially interposed between chevron columns 10 and 11. Because of these magnetic poles, bubbles are transferred to chevrons 10 and 11 and effectively split at cutter bar 12A. As field $H_R$ continues to rotate counterclockwise, bubbles are transferred through chevrons 10 and 11 to the right-most ends thereof as separate bubbles.

The device shown in FIG. 1 thus operates as a passive replicator, i.e. no control signals are required, and transfers a single bubble from propagation path 14 to output paths A and B as two separate bubbles. The device of the replicator uses elongated bars 12 as the stretching or expanding element. The elongated bars are extremely advantageous in that a deep potential well at the right end thereof exerts a considerable stripping effect even at high bias. Consequently, the bubble from path 14 will stretch more readily and more quickly wherein improved operation is achieved.

In one investigation of the replicator shown in FIG. 1, it has been shown that for a 16 $\mu$m period device with a garnet-to-permalloy spacing of 0.58$\mu$m, a margin of 12-14 Oe at 50 Oe is obtained. This operational characteristic is considerably better than prior art devices.

Figure 2:
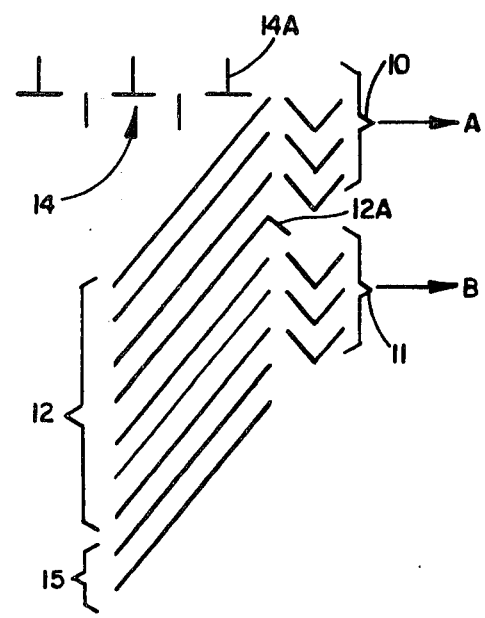
FIG. 2 is a schematic representation of another embodiment of the instant invention.

Referring now to FIG. 2, there is shown another embodiment of the instant invention. In FIG. 2, components which are similar to those shown in FIG. 1 bear similar reference numerals. However, an additional plurality of bars 15 are provided. Bars 15 are substantially parallel and coextensive with bars 12. However, bars 15 (two of which are shown although any suitable number can be utilized) are positioned beyond the end of the column of chevrons 11. Bars 15 may be utilized in some areas to control the operation of the bubble transferred from propagation path 14. For example, in certain low bias field situations, the bottom bubble section which is split off at cutter bar 12A may expand and strip out along the bottom-most elongated bars 12. In this situation, these bubbles may continue to propagate along the bottom-most bars 12 and eventually be driven therefrom. In order to prevent this situation, bars 15 provide, essentially, repelling bars which repel the bubble back toward chevrons 11. That is, repelling bars 15 provide poles (and barriers) which prevent the bubbles from stripping-out from chevrons 11 to bars 12 when the rotating field produces magnetic poles at the left end of bars 12.

Figure 3:
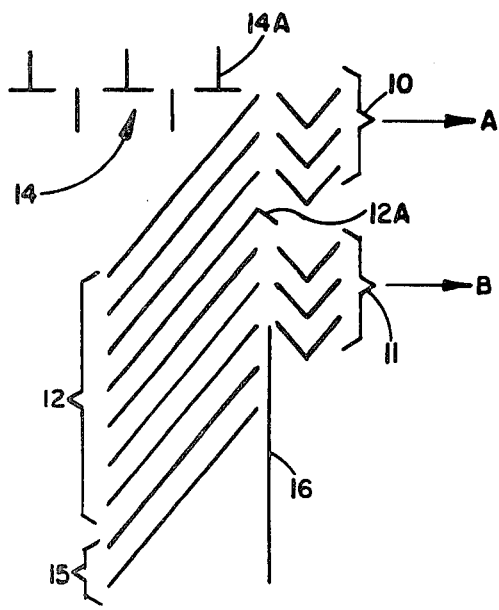
FIG. 3 is another embodiment of the instant invention.

Referring now to FIG. 3, there is shown a schematic representation of another embodiment of the instant invention. Again, the components in FIG. 3 which bear reference numerals similar to those in previous figures are similar components. In the embodiment shown in FIG. 3, an additional repeller or pusher bar 16 is provided. The pusher bar is arranged substantially perpendicular to the propagation paths to provide a magnetic pole between the ends of bars 12 and chevrons 11 in propagation path B. In particular, as the rotational field $H_R$ rotates in the counter-clockwise direction, a magnetic pole is produced at the right ends of chevrons 12 and 15 to which a bubble would tend to expand. Subsequently, a magnetic pole is produced at the upper end of repeller bar 16 which tends to push the bubble back up the pattern of bars 15. Again, subsequently, a magnetic pole is generated at the left ends of chevrons 11 to transfer the bubble from chevrons 12 to chevrons 11.

It should be understood, of course, that in the embodiment shown in FIG. 3, bars 15 may be omitted and additional bars parallel (or substantially parallel) to repeller bar 16 may be included. These repeller bars generally retard the strip out of the bubble along the bottom of bars 12 under low bias.

Figure 4:
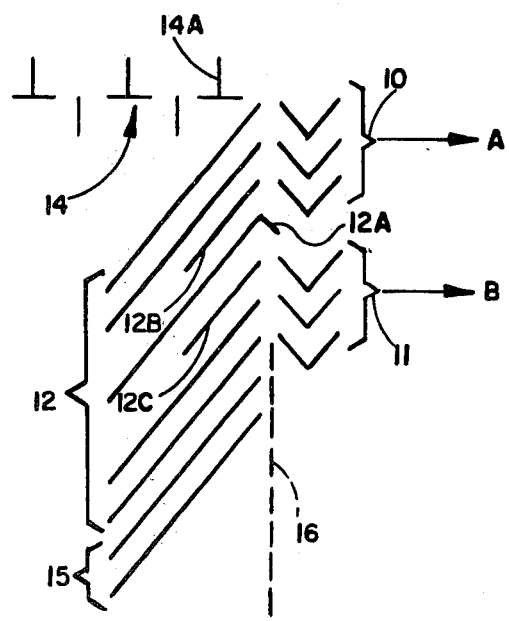
FIG. 4 is a schematic representation of another embodiment of the instant invention.

Referring now to FIG. 4, there is shown a schematic representation of another embodiment in the instant invention. Again, components which are similar to those shown in previous embodiments bear similar reference numerals. However, in FIG. 4 certain of elongated bars 12 have been foreshortened. In particular, bars 12B and 12C are shown as shorter than the remainder of the stretcher bars. While two bars are shown shortened, it is conceivable that one or more bars may be shortened in accordance with the specific pattern to be determined to be the most advantageous for any given system. Typically, however, the shortened bars are disposed adjacent to cutter bar 12A. Again, elongated bars 15 or repeller bar 16 may be included or omitted as desired. The shortened bars 12B and 12C will reduce, in certain situations, the possibility of production of stray bubbles caused by cutting of bubbles by the bars adjacent to the cutter element 12A. While this potential problem could possibly be eliminated by moving the chevron tracks closer together, the approach of shortening bars 12B and 12C is desirable whereby the propagation tracks can be maintained widely separated to avoid any interaction therebetween.

Thus, there have been shown and described preferred embodiments of a passive replicator. In particular, there is shown a plurality of elongated bars interposed between input and output propagation paths. The elongated bars are disposed at an angle relative to the propagation paths. The output paths are shown as chevrons having a specific angle with the propagation paths. The elongated bars are depicted as having a steeper angle than the chevron elements. A number of bars is shown and suggested along with a number of propagation paths and elements therein. Any number of bars or elements can be utilized as a function of the specific operations required and the operating parameters involved.

It is recognized that those skilled in the art may conceive modifications to the invention. For example, it is possible that more output paths may be utilized or a larger number of elongated bars may be incorporated wherein the output paths may be more widely spaced apart. However, any modifications which fall within the purview of the instant description are intended to be included herein.

Having thus described a preferred embodiment of the invention, what is claimed is:

1. A passive replicator device comprising
   first propagation path means for propagating information therealong in a first direction,
   second and third propagation path means for propagating information therealong,
   said second and third propagation paths disposed adjacent to said first propagation path in order to receive information from said first propagation path such that information is propagated in said first, second and third propagation paths substantially in said first direction,
   said second and third propagation paths having ends thereof substantially adjacent to each other and in substantially parallel arrangement,
   said first propagation path having an end thereof adjacent to said ends of said second and third propagation paths and substantially in abutment therewith,
   a plurality of elongated bars in substantially parallel arrangement,
   said plurality of elongated bars disposed adjacent to said ends of said first, second and third propagation paths,
   an end of at least one of said elongated bars interposed between said end of said first propagation path and the end of at least one of said second and third propagation paths whereby said plurality of elongated bars will receive information propagating along said first propagation path and expand said information to substantially encompass said ends of said second and third propagation paths,
   each of said plurality of elongated bars having length substantially greater than the length of said ends of said first, second and third propagation paths, and
   a cutter bar associated with said elongated bars,
   said cutter bar including an elongated bar having a relatively shorter bar portion disposed at an angle to said elongated bar and projecting between said ends of said second and third propagation paths.

2. The combination recited in claim 1 wherein said plurality of elongated bars extends beyond the end portions of said second and third propagation paths in a direction substantially normal to the direction of propagation through said paths.

3. The combination recited in claim 1 including at least one repeller bar arranged substantially normal to the direction of propagation adjacent the ends of said plurality of magnetic bars and said third propagation path.

4. The combination recited in claim 1 wherein at least one of said elongated bars is arranged to be shorter than the remainder of said elongated bars.

5. Magnetic apparatus comprising
   a layer of material in which single wall domains can be moved,
   a multistage pattern of devices coupled to said layer and operative responsive to a magnetic field reorienting in the plane of said layer to move domains from stage to stage along a path, said pattern defining in a reference stage a linear array of elongated elements forming attracting poles for enlarging said domains laterally with respect to said path, said reference stage including an additional element arrangement, said additional element arrangement connected to and angularly disposed with respect to one of said elongated elements of said reference stage in a manner to generate an intermediate repelling pole for cutting domains moved from said reference stage to a next subsequent stage.

6. A passive replicator comprising a first propagation path, a plurality of substantially linear elongated magnetizable elements disposed adjacent to said first propagation path and at an angle therewith in order to receive and expand a magnetic bubble domain therefrom, second and third propagation paths adjacent to said plurality of elements to receive portions of an expanded bubble therefrom, and a relatively short element angularly connected to at least one of said elongated elements and interposed between said second and third propagation paths to selectively provide a magnetic pole which severs an expanded bubble domain into at least two separate domains which are received by said second and third propagation paths, respectively.

7. The passive replicator recited in claim 6 comprising a further plurality of elongated magnetizable elements disposed parallel to the first mentioned plurality of elongated magnetizable elements, at least one repeller bar arranged substantially normal to said first propagation path and adjacent the ends of said further plurality of elongated magnetizable elements, and at least one relatively short magnetizable element disposed adjacent to the elongated element having said short element connected thereto.

8. The passive replicator recited in claim 6 wherein said second and third propagation paths are formed of chevron elements, and said elongated magnetizable elements are arranged approximately normal to the near side of said chevrons.

* * * * *